(12) United States Patent
Hart et al.

(10) Patent No.: US 11,757,374 B2
(45) Date of Patent: Sep. 12, 2023

(54) METHOD AND APPARATUS FOR GENERATING A THREE-PHASE VOLTAGE

(71) Applicant: YASA LIMITED, Kidlington (GB)

(72) Inventors: Simon David Hart, Powys (GB); Samuel David Ahearn, Montgomery (GB); Richard Phillips, Banbury (GB); Tim Woolmer, Waterperry (GB)

(73) Assignee: YASA LIMITED, Kidlington (GB)

(*) Notice: Subject to any disclaimer, the term of this patent is extended or adjusted under 35 U.S.C. 154(b) by 0 days.

(21) Appl. No.: 17/531,167

(22) Filed: Nov. 19, 2021

(65) Prior Publication Data
US 2022/0166346 A1    May 26, 2022

(30) Foreign Application Priority Data
Nov. 20, 2020    (GB) .................................... 2018294

(51) Int. Cl.
*H02M 7/538*    (2007.01)
*H02M 7/5387*   (2007.01)
*G01R 19/165*   (2006.01)
*H02M 1/15*     (2006.01)

(52) U.S. Cl.
CPC .. *H02M 7/53871* (2013.01); *G01R 19/16538* (2013.01); *H02M 1/15* (2013.01)

(58) Field of Classification Search
CPC ................ H02M 1/15; H02M 7/53871; G01R 19/16538
See application file for complete search history.

(56) References Cited

U.S. PATENT DOCUMENTS

| 4,228,491 A | 10/1980 | Abraham et al. |
| 8,958,222 B2 | 2/2015 | Hart |
| 2011/0182093 A1* | 7/2011 | Brogan ............... H02M 5/4585 363/79 |
| 2018/0331645 A1* | 11/2018 | Aoki ................. H02M 7/53875 |
| 2019/0334454 A1 | 10/2019 | Itoh et al. |

FOREIGN PATENT DOCUMENTS

JP    4143918 B2 *  9/2008

OTHER PUBLICATIONS

UK Intellectual Property Office. Combined Search and Examination Report, issued in Application No. GB2018294.5 dated May 12, 2021. 5 pages.

* cited by examiner

*Primary Examiner* — Harry R Behm
(74) *Attorney, Agent, or Firm* — Meunier Carlin & Curfman LLC

(57) ABSTRACT

We describe techniques to reduce DC ripple voltage in an inverter by determining a plurality of switching events for each of the three phases in each Pulse Width Modulation (PWM) period. The switching events provide a desired target output voltage for the respective PWM period. From this determination of the switching events, a comparison can be made to determine a first time period between a first and second switching event across all of the phases, and a second time period between the second and a third switching event across all of the phases. The timing of one or more switching events in only one of the phases in the respective PWM period is adjusted in response to the determined time period being greater than a threshold in order to reduce the determined first or second time period.

38 Claims, 13 Drawing Sheets

Solution 3

METHOD AND APPARATUS FOR GENERATING A THREE-PHASE VOLTAGE

CROSS-REFERENCE TO RELATED APPLICATIONS

This application claims priority to and benefit of GB Application No. 2018294.5, filed Nov. 20, 2020, which is incorporated by reference in its entirety.

FIELD OF THE INVENTION

The present invention relates to a method of generating a three-phase voltage, and an apparatus for generating a three-phase voltage. In particular, the present invention relates to a method of generating a three-phase voltage, and an apparatus for generating a three-phase voltage for driving a load, such as an electric motor, and an inverter for driving a load such as an electric motor.

BACKGROUND OF THE INVENTION

Power inverters are generally known. One example may be found in U.S. Pat. No. 8,958,222, from which FIG. 1 is taken, and shows a three phase power inverter 100 for converting a DC power supply 101 to an AC output 103 which may then be connected to a load (not shown). The inverter comprises three separate phases 200, 300, 400 (also referred to as phases U, V, W respectively). Each phase includes two switches in series: 200a, 200b in phase 200/U; 300a, 300b in phase 300/V; and 400a, 400b in phase 400/W. Switches 200a, 300a and 400a are connected to the positive rail 105 (and may be referred to as the "upper" switches) and switches 200b, 300b and 400b are connected to the negative rail 107 (and may be referred to as the "lower" switches). In FIG. 1, each switch may be an IGBT (insulated gate bipolar transistor) and, for each IGBT, an associated anti-parallel diode may be used (not shown). However, any switches with fast switching capability may be used. A control system (such as a processor) (not shown) controls the switching of the switches 200a, 200b, 300a, 300b, 400a, 400b to control the AC output of the inverter 100. The power inverter also includes a DC bus capacitor 102, which provides a more stable DC voltage, limiting fluctuations as the inverter sporadically demands heavy current.

A sinusoidal output current can be created at AC output 103 by a combination of switching states of the six switches. However, the inverter 100 must be controlled so that the two switches in the same phase are never switched on at the same time, so that the DC supply 101 is not short circuited. Thus, if 200a is on, 200b must be off and vice versa; if 300a is on, 300b must be off and vice versa: and if 400a is on, 400b must be off and vice versa. This results in eight possible switching vectors for the inverter, as shown in FIG. 2 shows the six active vectors and the two zero voltage vectors of Table 1 graphically portrayed in an inverter voltage switching hexagon. Such vectorial representation of three-phase systems is well known to the skilled person and will not be described in detail. However, in general, any three-phase system can be represented uniquely by a rotating vector $V_S$, as shown in FIG. 2. The rotating vector $V_S$ comprises components of the six active vectors shown in Table 1 and FIG. 2. This is known as Space Vector Modulation (SWM). The voltage at the AC output 103 can be changed by varying the ratio between the zero voltage vectors $V_0$ and $V_7$ and the active vector $V_S$ (comprising components of $V_1$ to $V_6$) (the modulation index) by pulse width modulation (PWM) techniques.

FIG. 3 shows an example of pulse width space vector modulation over one switching period according to the prior art. The switching function for each switch 200a, 300a, 400a is a time waveform taking the value 1 when the switch is on and 0 when the switch is off. Referring to FIG. 3, during the first period t0/2, all three switches 200a, 300a, 400a are off (value 0) which produces vector $V_O$ of Table 1. $V_O$ is a zero-voltage vector, so this time period is an inactive period. In the second period t1, switch 200a takes the value 1 and switches 300a and 400a take the value 0, which produces vector $V_1$, which is an active vector. In the third period t2, switches 200a and 300a take the value 1 and switch 400a takes the value 0, which produces vector $V_2$, which is also an active vector. Finally, during the fourth period t0/2, all three switches 200a, 300a, 400a are on (value 1) which produces zero voltage vector $V_7$ of Table 1. Thus, the active periods are t1 and t2 and the inactive period is t0. The ratio between the total active period (in this case, t1+t2) and total inactive period (in this case, t0/2+t0/2=t0) determines the output voltage at the AC output.

FIG. 4 shows phase voltages (with respect to the 0V line shown in FIG. 1, which is half of the dc bus) with symmetric switching versus output voltage angle (with a DC bus of 250V and a 200V peak demand). FIG. 5 shows the resulting line to line voltage as seen by the motor load.

As mentioned above, the DC bus capacitor 102 provides a more stable DC voltage, limiting fluctuations as the inverter sporadically demands heavy current. The DC-link capacitor balances fluctuating instantaneous power on the inverter DC rails injected by activity from the switching stages 200, 300, 400. Average ripple current/voltage (specified at a given frequency and DC supply voltage) is the total amount of Root Mean Square (RMS) alternating and direct current/voltage that a capacitor can withstand without failing. Peak inverter ripple voltage is the voltage measured between the minimum DC and the maximum DC across the DC-link capacitors. These voltage peaks are not smoothed

TABLE 1

In Table 1, the vector values are the states of the three upper switches 200a, 300a, 400a, with the three lower switches 200b, 300b, 400b necessarily taking the opposite state to avoid shorting out the DC supply.

| Vector | 200a | 300a | 400a | 200b | 300b | 400b | $V_{UW}$ | $V_{WV}$ | $V_{VU}$ | |
|---|---|---|---|---|---|---|---|---|---|---|
| $V_0 = \{000\}$ | OFF | OFF | OFF | ON | ON | ON | 0 | 0 | 0 | Zero |
| $V_1 = \{100\}$ | ON | OFF | OFF | OFF | ON | ON | $+V_{dc}$ | 0 | $-V_{dc}$ | Active |
| $V_2 = \{110\}$ | ON | ON | OFF | OFF | OFF | ON | 0 | $+V_{dc}$ | $-V_{dc}$ | Active |
| $V_3 = \{010\}$ | OFF | ON | OFF | ON | OFF | ON | $-V_{dc}$ | $+V_{dc}$ | 0 | Active |
| $V_4 = \{011\}$ | OFF | ON | ON | ON | OFF | OFF | $-V_{dc}$ | 0 | $+V_{dc}$ | Active |
| $V_5 = \{001\}$ | OFF | OFF | ON | ON | ON | OFF | 0 | $-V_{dc}$ | $+V_{dc}$ | Active |
| $V_6 = \{101\}$ | ON | OFF | ON | OFF | ON | OFF | $+V_{dc}$ | $-V_{dc}$ | 0 | Active |
| $V_7 = \{101\}$ | ON | ON | ON | OFF | OFF | OFF | 0 | 0 | 0 | Zero | out by the DC supply due to the impedance between the DC supply and the inverter DC-link capacitors. There is often a limit on the peak ripple voltage (determined at the system level) so that other equipment connected to the DC supply locally to the inverter is not adversely affected by the operation of the inverter. The ripple voltage increases under heavier loads or greater modulation indices, and thus so does the technical requirements for the DC bus capacitor. Often designers have to over-specify (peak-to-peak voltage, capacity etc) the DC bus capacitor so that it can cope with the worst-case scenario for any given load or modulation index. This can result in large, expensive capacitors, which add weight and significant cost to the design of an inverter.

Some prior art techniques attempt to reduce the DC bus ripple by increasing the switching frequency of the inverter. For example, some designs have been shown to exhibit a peak to peak ripple voltage of around 30V at a 10 kHz switching frequency. Increasing the switching frequency to 20 kHz reduces that peak to peak DC bus ripple by over 15V. The switching frequency can be varied dependent on the load, and thus the voltage ripple, conditions.

However, increasing the switching frequency can result in increased switching losses within the inverter and can also increase switching noise (both audible and electromagnetically). Furthermore, the reduction in voltage ripple does not decrease linearly as the switching frequency increases, thus increasing the switching frequency further has diminishing returns with regards to improved voltage ripple.

As such, we have appreciated the need for an improved technique in order to reduce the DC bus ripple for an inverter.

SUMMARY OF THE INVENTION

The present invention therefore provides a method of generating a three-phase output voltage, and an inverter for generating a three-phase output voltage, for driving an electrical load in accordance with the independent claims appended hereto.

Further advantageous embodiments are also provided in accordance with the dependent claims, also appended hereto.

In particular, we describe a method of generating a three-phase output voltage for powering an electrical load, the method comprising: receiving an input voltage from a voltage source and controlling a controller, using Pulse Width Modulation (PWM) over a plurality of PWM periods, to generate a three phase AC output for an electrical load, each of the plurality of PWM periods comprising one or more switching events, the switching events comprising rising and falling edges between a low voltage and a high voltage to provide ON periods at the high voltage and OFF periods at the low voltage, each of the plurality of PWM periods generating a portion in time of the three phase AC output voltage; for each respective PWM period: determine a plurality of switching events for each of the three phases to provide a target output voltage for the respective PWM period; and compare the switching events across each of the three phases to determine a first time period between a first and second switching event across all of the phases, and a second time period between the second and a third switching event across all of the phases; and adjusting the timing of one or more switching events in only one of the phases in the respective PWM period in response to the determined time period being greater than a threshold in order to reduce the determined first or second time period.

We have identified that it is possible to manipulate the timing of the switching events on a single phase, which reduces the maximum no switch time deltas in order to reduce the DC voltage ripple. In reducing the DC bus ripple, designers may then implement an inverter with an improved DC bus ripple performance, or the designer may utilise smaller DC bus capacitors (for the same amount of DC bus ripple as without an improved technique) in the design of an inverter. Or the designer may utilise a combination of both advantages in their design. Since only one phase has an increase in switching events, the increase in switching loss is less than prior art techniques that increase the number of switching events in all phases.

When the first time period between the first and second switching events is greater than the second time period between the second and third switching events for the respective PWM period, the switching events in only one of the phases may be adjusted such that the ON period is split into first and second ON portions, and wherein the first ON portion may be advanced in time and the second ON portion may be delayed in time within the respective PWM period.

The first and second ON portions may be equal in duration.

When the previous PWM period ends during an OFF period, the first ON portion may be advanced to be centred around the time associated with a ¼ of the PWM period. The respective PWM period may start and/or end with the only one phase in the OFF state.

When the first time period between the first and second switching events is greater than the second time period between the second and third switching events for the respective PWM period, and when the previous PWM period ends during an ON period, the first ON portion may be advanced to the start of the respective PWM period such that an ON period spans the end of the previous PWM period and the start of the respective PWM period.

The second ON portion may be delayed in time to be centred around the time associated with ¾ of the PWM period.

When the second time period between the first and second switching events is greater than the first time period between the second and third switching events for the respective PWM period, the switching events may be adjusted such that the ON period is split into first, second and third ON portions, the first ON portion being advanced towards the start of the respective PWM period, the second ON portion occurring centred around the time associated with ½ of the PWM period, and the third ON portion being delayed towards the end of respective PWM period.

In this scenario, the first ON portion is advanced to the start of the respective PWM period and the third ON portion is delayed to the end of the respective PWM period, such that the respective PWM period starts and ends with the only one phase in the ON state. The respective PWM period may comprise a first OFF period between the first and second ON portions centred around the time associated with a ¼ of the PWM period.

When the previous PWM period ends with an OFF state, the first ON portion may be further adjusted to be immediately before the second ON portion such that the first and second ON portions combine to form an ON portion having the combined durations of the first and second ON portions. This helps transition between different schemes in adjacent PWM period.

The respective PWM period may comprise a second OFF period between the second and third ON portions centred around the time associated with ¾ of the PWM period.

When the respective PWM period ends with an ON state, and when the next PWM period starts with an OFF period and the determined time period for the respective next PWM period is less than the threshold, the method may comprise adjusting the timing of one or more switching events in the only one of the phases in the respective next PWM period. This helps transition between different schemes in adjacent PWM period.

The timing of the switching events in the only one of the phases for the respective next PWM period may be adjusted such that an ON period is split into first and second ON portions, and wherein the first ON portion is advanced in time within the respective next PWM period. The first ON portion in the respective next PWM period may be advanced in time to the start of the respective next PWM period such that an ON period spans the end of the respective PWM period and the start of the respective next PWM period.

The second ON period in the respective next PWM period may have a duration that is equal to the unadjusted ON period of the respective next PWM period minus the duration of the first ON portion of the respective next PWM period.

The plurality of switching events may cause a voltage ripple on the supply voltage. The method may comprise: for each respective PWM period, determine the peak to peak voltage ripple on the supply voltage for the target output voltage for the respective PWM period; and wherein the step of adjusting the timing of one or more switching events in only one of the phases in the respective PWM period occurs when the peak to peak voltage ripple on the supply voltage is greater than a threshold value. This enables the method only to be used in operating conditions more suited to the benefits of the method, and enables the method to be switched off when it provides less benefit.

The step of adjusting the timing of one or more switching events in only one of the phases in the respective PWM period may occur when a modulation index of the output voltage is greater than or equal to unity.

In any of the above methods, the electrical load may comprise an electric motor.

We also describe an inverter for generating a three-phase output voltage for powering an electrical load, the inverter comprising: an input for receiving an input voltages; three AC outputs, one per phase, for outputting a three phase AC output voltage for powering an electrical load; an input for receiving data representing a demand output voltage from the inverter; and a controller for controlling the input voltage using Pulse Width Modulation (PWM) over a plurality of PWM periods to generate the three phase AC output voltages for an electric motor, each of the plurality of PWM periods comprising one or more switching events, the switching events comprising rising and falling edges between a low voltage and a high voltage to provide ON periods at the high voltage and OFF periods at the low voltage, each of the plurality of PWM periods generating a portion in time of the three phase AC output voltages; wherein the controller is configured to: for each respective PWM period: determine a plurality of switching events for each of the three phases to provide a target output voltage for the respective PWM period; and compare the switching events across each of the three phases to determine a first time period between a first and second switching event across all of the phases, and a second time period between the second and a third switching event across all of the phases; and wherein the controller is configured to adjust the timing of one or more switching events in only one of the phases in the respective PWM period in response to the determined time period being greater than a threshold in order to reduce the determined first or second time period.

We have identified that it is possible to manipulate the timing of the switching events on a single phase, which reduces the maximum no switch time deltas in order to reduce the DC voltage ripple. In reducing the DC bus ripple, designers may then implement an inverter with an improved DC bus ripple performance, or the designer may utilise smaller DC bus capacitors (for the same amount of DC bus ripple as without an improved technique) in the design of an inverter. Or the designer may utilise a combination of both advantages in their design. Since only one phase has an increase in switching events, the increase in switching loss is less than prior art techniques that increase the number of switching events in all phases.

In such an inverter, the plurality of switching events may cause a voltage ripple on the supply voltage. The controller may be configured to: for each respective PWM period, determine the peak to peak voltage ripple on the supply voltage for the target output voltage for the respective PWM period; and wherein the controller may be configured to adjust the timing of one or more switching events in only one of the phases in the respective PWM period occurs when the peak to peak voltage ripple on the supply voltage is greater than a threshold value.

The controller may be configured to adjust the timing of one or more switching events in only one of the phases in the respective PWM period when a modulation index of the output voltage is greater than or equal to unity.

The electrical load connected to the inverter may comprise an electric motor.

LIST OF FIGURES

The present invention will now be described, by way of example only, and with reference to the accompanying figures, in which.

Figure 16A:
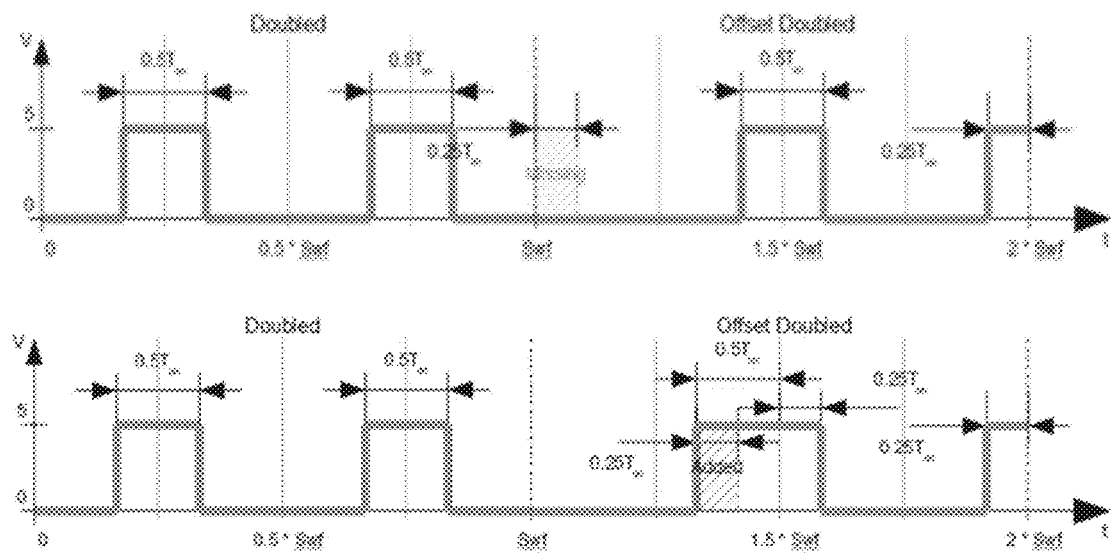
Figure 17:
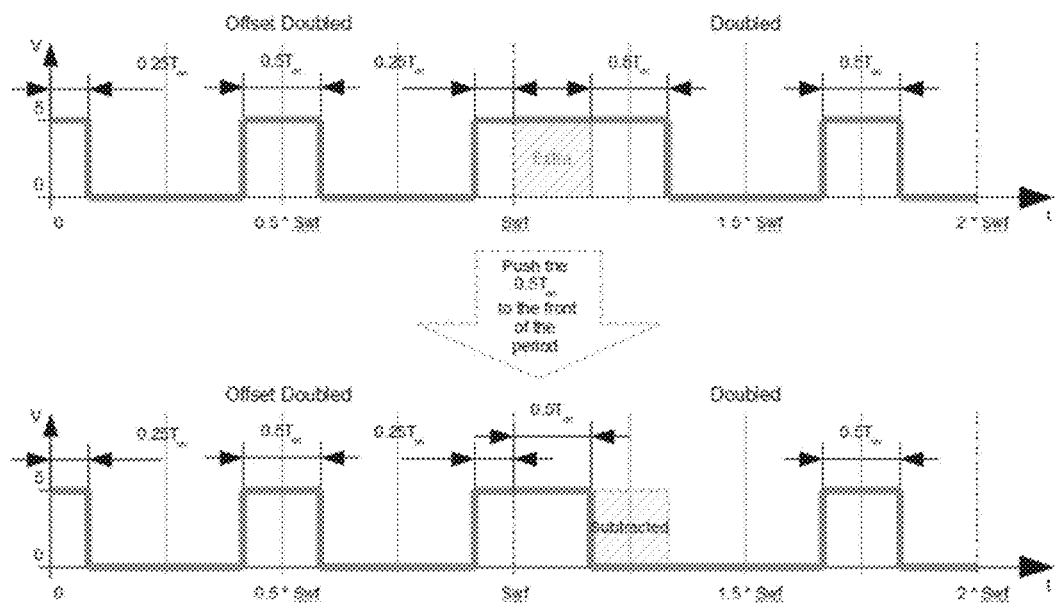
Figure 18:
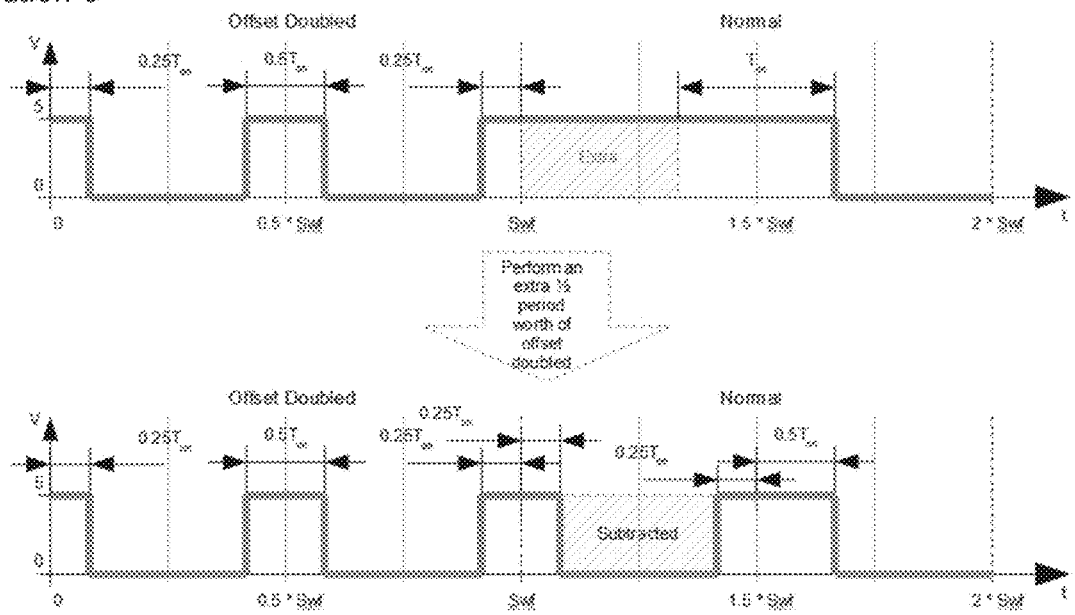

FIG. 16a and b illustrate the first solution to the transitions between schemes;

FIG. 17 shows the second solution to the transition between schemes;

FIG. 18 shows the second solution to the transition between schemes; and

Figure 19A:
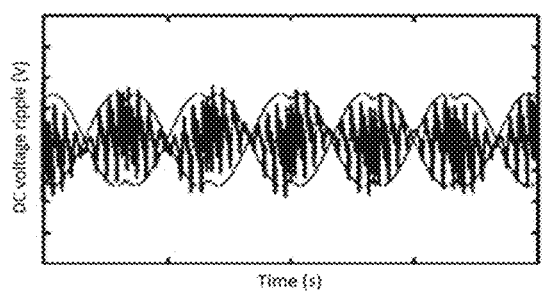
Figure 19B:
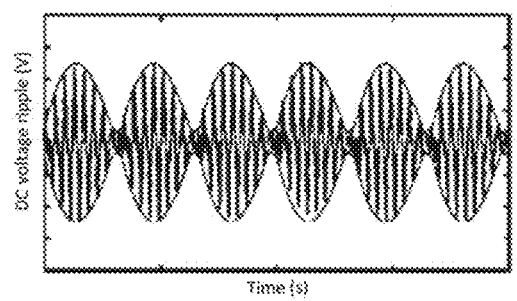
Figure 19C:
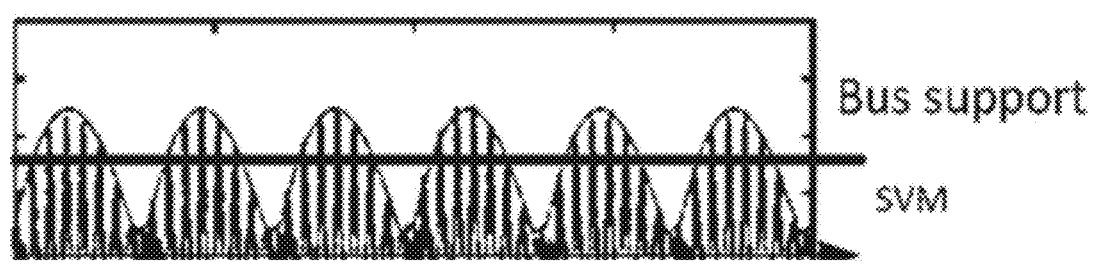

FIGS. 19a and 19b show example DC bus link ripple voltages under different conditions over one output frequency wave, and FIG. 19c shows one example threshold level for deciding whether or not to implement the modified scheme.

DETAILED DESCRIPTION OF THE PREFERRED EMBODIMENTS

It is known that the level of DC voltage ripple is influenced by the largest separation between switch transition edges in the inverter. As such, known techniques increase the switching frequency on all phases, which reduces this separation between switch transition edges and hence reduces the ripple. However, increased switching frequency, as discussed above, results in increased switching losses in the switching devices.

Figure 6:
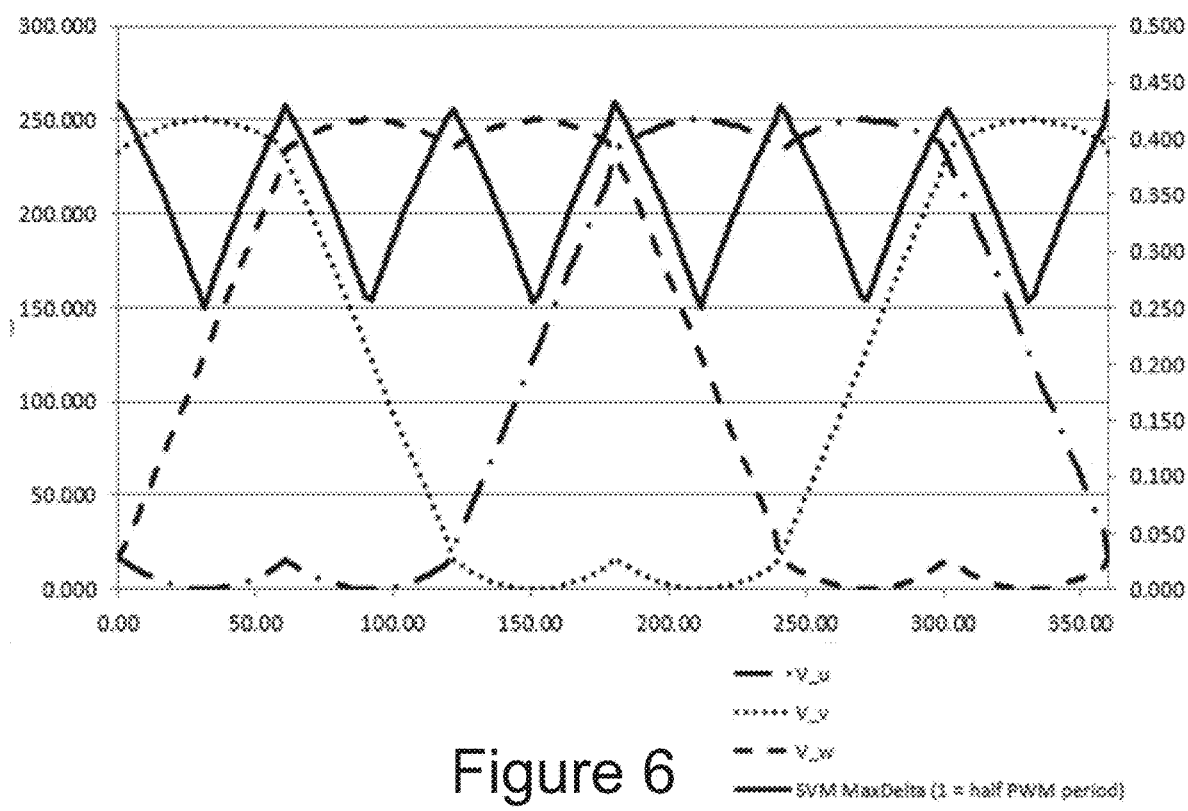
FIG. 6 shows the maximum no-switch-time deltas.

FIG. 6 shows the maximum no switch time deltas (time during which there are no power devices switching between ON to OFF or vice versa) per switching period in black. U phase in a dash-dotted line, V phase in a dotted line and W in a dashed line. The example shown here is for 250 Vac from a 500 Vdc bus.

In order to reduce DC bus ripple voltage, an alternative technique is required to reduce these no switch time deltas. Pulse Width Modulation (PWM) techniques, such as Space Vector Modulation (SVM), offer flexibility with control schemes. In multiphase outputs such as three-phase outputs, so long as the resulting line-to-line voltages appear to the load as a suitable voltage (for example for a motor a generally sinusoidal voltage between lines), the load is indifferent to what happens to the absolute voltage on each of the lines at any one point. As such, this opens up possibilities to control the timing of individual switching events in order to reduce the no switch time deltas.

We have identified that it is possible to manipulate the timing of the switching events on a single phase, which reduces the maximum no switch time deltas in order to reduce the DC voltage ripple. In reducing the DC bus ripple, designers may then implement an inverter with an improved DC bus ripple performance, or the designer may utilise smaller DC bus capacitors (for the same amount of DC bus ripple as without an improved technique) in the design of an inverter. Or the designer may utilise a combination of both advantages in their design.

Figure 7:
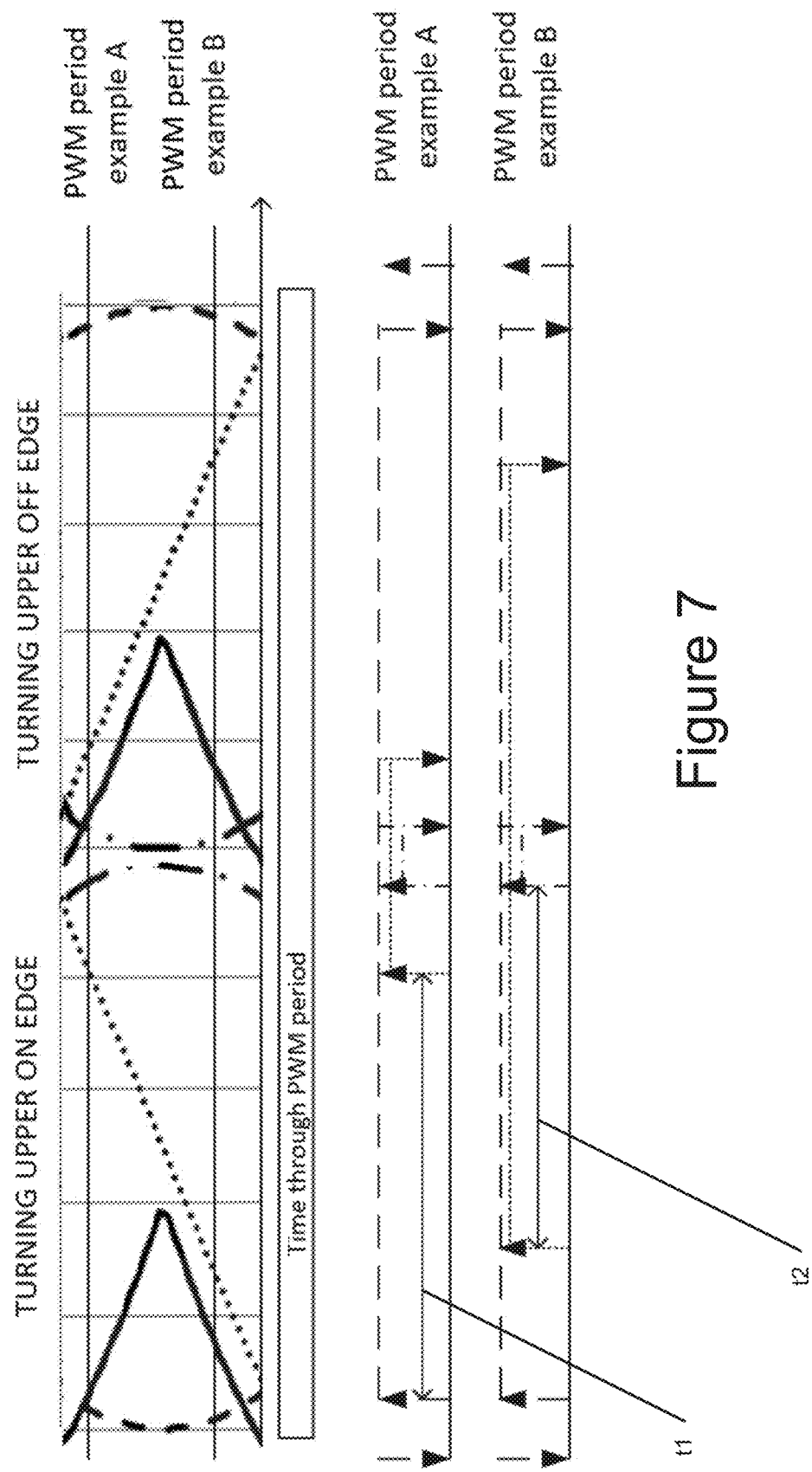
FIG. 7 shows a switch timing plot for a standard SVM scheme.

FIG. 7 shows a switch timing plot for a standard SVM scheme. The U phase is in a dashed-dotted line, the V phase is in a dotted line and the W phase is in a dashed line. The Top plot shows the upper turn on/off placement curves for a 60 deg sector for unity modulation. For over modulation the curves for U and W would be straight lines at the extent of the curves shown above.

As in standard SVM, $T_0$ is the zero-vector time and can be seen as the delta between the two blue N curves. $T_1$ is the time delta between red U and yellow V and $T_2$ is the time delta between yellow V and blue W.

Two examples of PWM timing patterns are shown as examples, A and B. In A the V phase is furthest away from the U phase and so the maximum time delta without a switching event is taken between the U and the V. The delta is shown as the black trace with increasing value to the right. As the V phase increases in voltage, the black trace follows a "v shape" until the tip which is when the V phase edge is half way between the U and the N phases. As the U phase moves closer to the U phase the maximum delta increases as the U phase edge moves away from the W phase edge. This gives rise to the DC voltage ripple being at 6 times the frequency of the output voltage waveform.

Standard SVM on its own does not present a means to reduce the maximum (and minimum) phase switching edge delta. However, if we constrain the method to always having edges every PWM period and consider only up to unity modulation, we can reduce the maximum time delta between edges by output angle controller placement of the $T_0$ period of individual phases.

In brief, the present invention addresses the DC ripple voltage by determining a plurality of switching events for each of the three phases in each PWM period. The switching events provide a desired target output voltage for the respective PWM period. From this determination of the switching events, a comparison can be made to determine a first time period ($T_1$) between a first and second switching event across all of the phases, and a second time ($T_2$) period between the second and a third switching event across all of the phases. The timing of one or more switching events in only one of the phases in the respective PWM period is adjusted in response to the determined time period being greater than a threshold in order to reduce the determined first or second time period. Key to this approach is that the timing of switching events in only one of the phases is adjusted, such that the other two phases (for example in a three-phase system) remain unchanged from the standard SVM timing scheme. This approach therefore reduces the no-switch-delta, and thus reduces the DC ripple voltage.

By only adjusting the timing of the switching events in only one of the phases, the switching losses in such a scheme are much reduced when compared to, say, the prior art scheme wherein the switching frequency of all phases in increased. So long as the line-to-line voltages remain consistent for the desired load, the switching scheme can be manipulated to reduce the DC ripple voltage.

Figure 8:
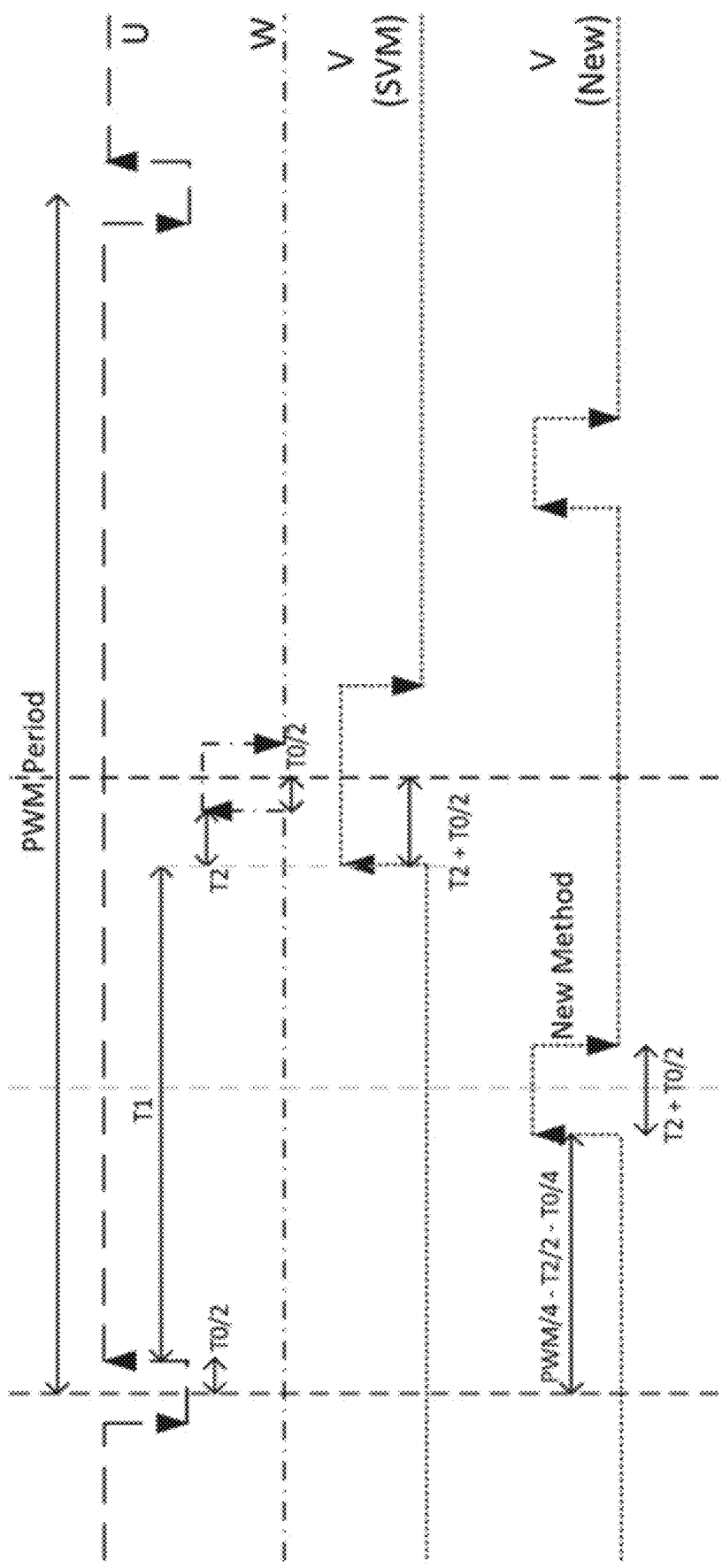
FIG. 8 shows a first PWM period for one of the segments using the new switching scheme.

FIG. 8 shows a PWM period for one of the segments. The U phase (top line) is shown in dashed, the W phase (second line down) is shown in dashed-dotted line, and the V phase (third and fourth lines down) are shown in dotted lines. The V phase is shown as it would be under a standard SVM scheme (third line down: Vsvm) and the modified/new scheme (fourth line down: Vnew).

FIG. 8 shows the condition where $T_1>T_2$, that is where the period between the first switching event (in this case the rising edge in the U phase) and the second switching event (in this case the rising edge in the V phase) is greater than the period between the second edge (the rising edge in the V phase) and the third switching event (in this case the rising edge in the W phase).

In such a scenario, the modified method adjusts the switching events in the only one of the phases such that the ON period in that respective phase is split into first and second ON portions. The first ON portion is advanced in time and the second ON portion is delayed in time within the respective PWM period. In this case, it is shown in the Vnew line that the first ON period is advanced to coincide around the time associated with a ¼ of the PWM period. The second ON portion is delayed in time to be centred around the time associated with ¾ of the PWM period. The first and second ON portions may be equal in duration, but they need not be. The advance and delay times may also have different values than those shown in the diagram.

The idea is that the active time in what would be the standard SVM pulse for that period is split and spread over the PWM period in order to reduce the no switch time delta. As can be seen, the no-switch-time delta for this waveform is much reduced due to the increased switching events in the V phase, and since the increase in switching frequency (in this case a doubling of switching frequency) only occurs in one phase, the increase in switching losses is not as great as in the case where all phases are switched at an increased frequency.

Figure 9:
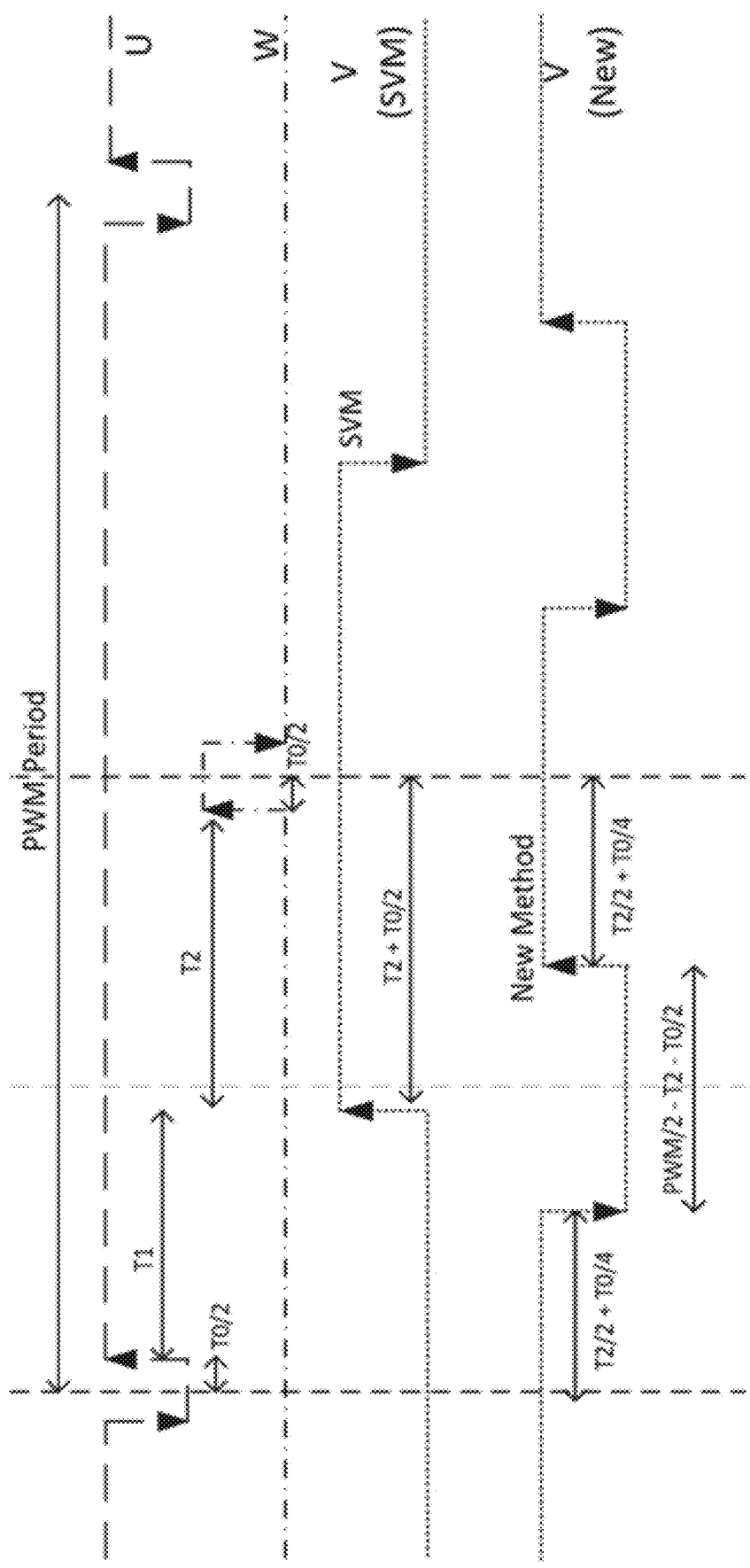
FIG. 9 shows a second PWM period for one of the segments using the new switching scheme.

FIG. 9 shows a second PWM period for one of the segments using the new switching scheme.

FIG. 9 shows the condition where $T_2>T_1$, that is where the period between the first switching event (in this case the rising edge in the U phase) and the second switching event (in this case the rising edge in the V phase) is less than the period between the second switching event (the rising edge in the V phase) and the third switching event (in this case the rising edge in the W phase).

Whilst it is possible to adjust the switching events using the same scheme as shown in FIG. 8 for the scenario shown in FIG. 9, it has been demonstrated that the DC ripple voltage can increase rather than decrease because the ON period of the modified phase becomes the maximum no-switch-time delta.

In such a scenario, the modified method therefore instead adjusts the switching events in only one of the phases such that the ON period is split into first, second and third ON portions. The first ON portion is advanced towards the start of the respective PWM period. The second ON portion occurs centred around the time associated with ½ of the PWM period. The third ON portion is delayed towards the end of respective PWM period.

In FIG. 9, the first ON portion is shown as being advanced to the start of the respective PWM period, and the third ON portion is shown as being delayed to the end of the respective PWM period, such that the respective PWM period starts and ends with the only one phase in the ON state.

Again, the idea is that the active time in what would be the standard SVM pulse for that period is split and spread over the PWM period in order to reduce the no switch time delta. As can be seen, the no switch time delta for this waveform is much reduced due to the increased switching events in the V phase, and since the increase in switching frequency (in this case a doubling of switching frequency) only occurs in one phase, the increase in switching losses is not as great as in the case where all phases are switched at an increased frequency.

FIG. 9 also shows that the respective PWM period comprises a first OFF period between the first and second ON portions centred around the time associated with a ¼ of the PWM period, and a second OFF period between the second and third ON portions centred around the time associated with ¾ of the PWM period. The first and second OFF portions may be equal in duration, but they need not be. The advance and delay times may also have different values than those shown in the diagram.

Whilst FIGS. 8 and 9 demonstrate the modified scheme has been applied to only the V phase, it would be apparent to the skilled reader that in other PWM periods, the modified scheme is applied to one of the other phases in turn.

Figure 2:
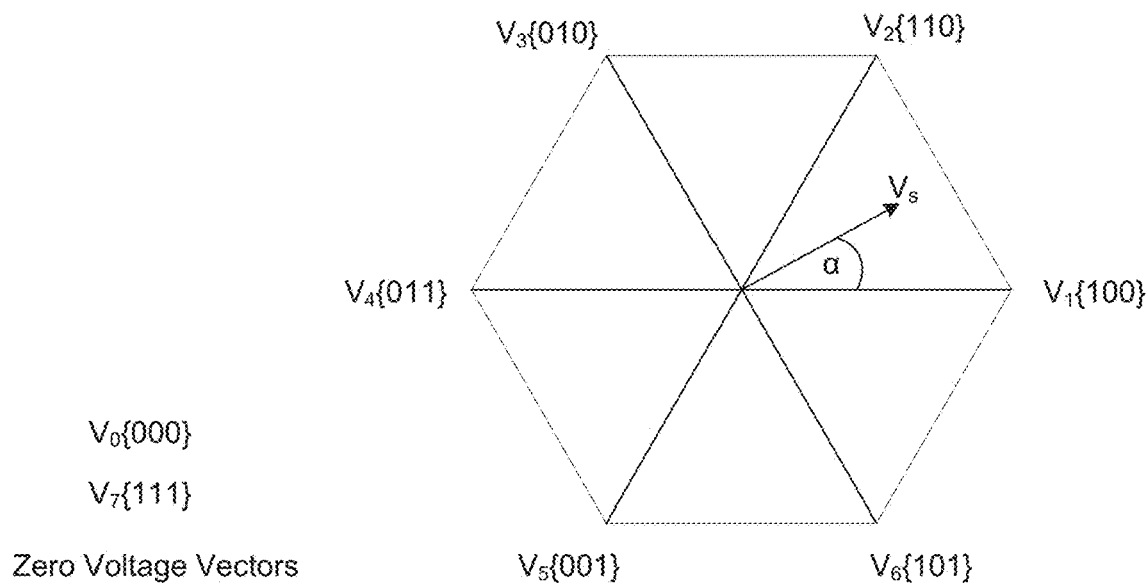
FIG. 2 shows a vector representation of the switching states of the inverter of FIG. 1.
Figure 3:
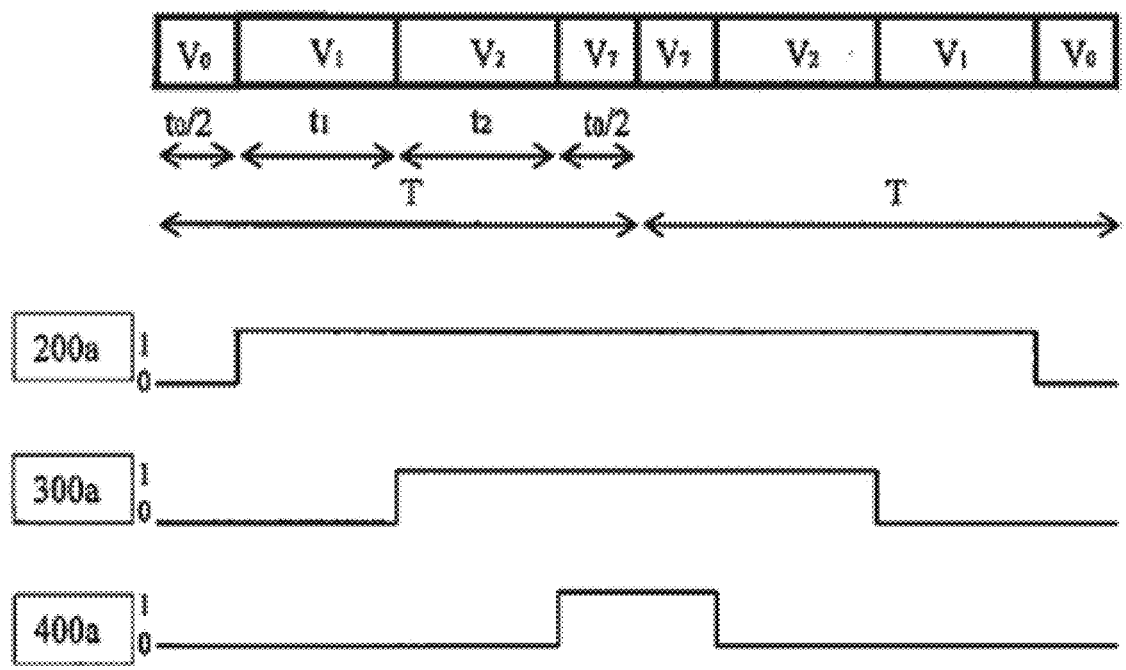
FIG. 3 shows an example of pulse width Space Vector Modulation (SVM) over one Pulse Width Modulation switching cycle.
Figure 4:
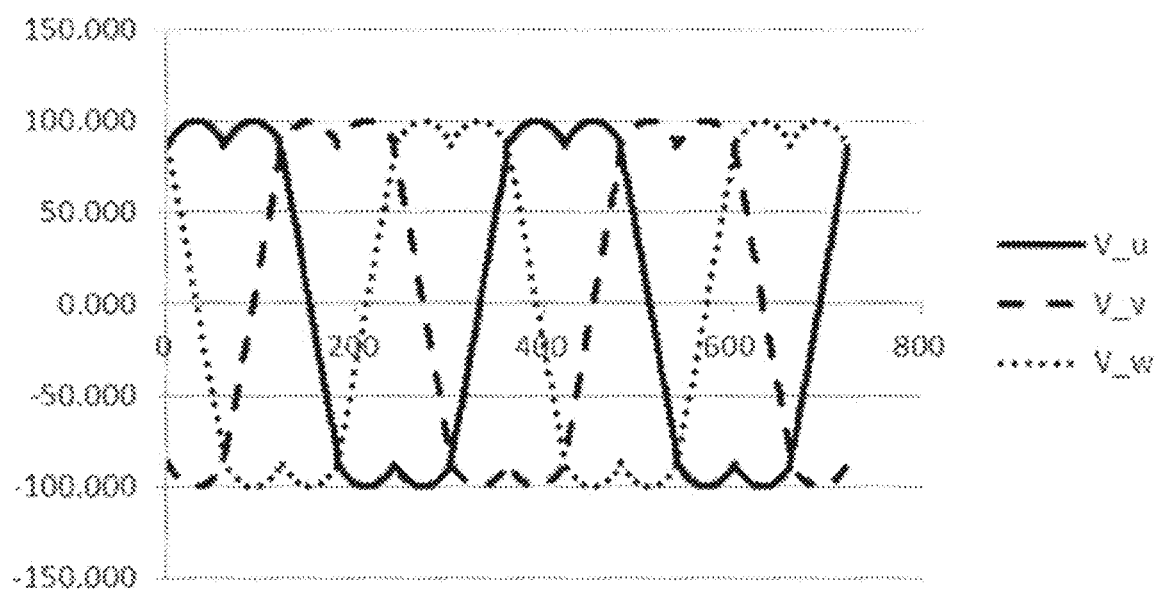
FIG. 4 shows phase voltages (with respect to the 0V line) at the output of the inverter of FIG. 1.
Figure 5:
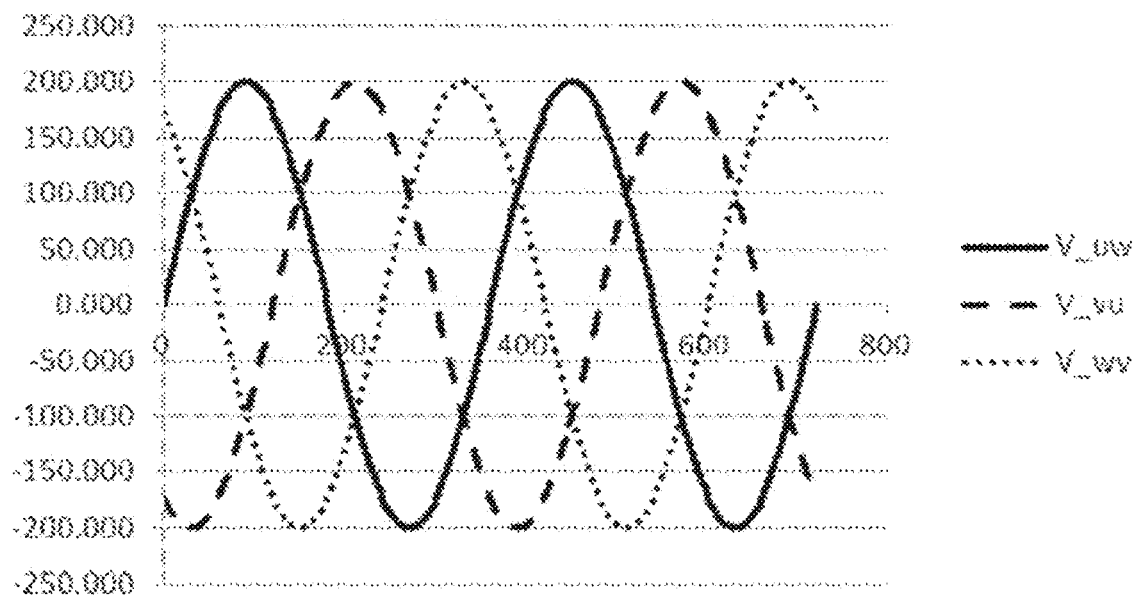
FIG. 5 shows the resulting line to line voltages at the output of the inverter of FIG. 1 as seen by the electrical load.
Figure 10:
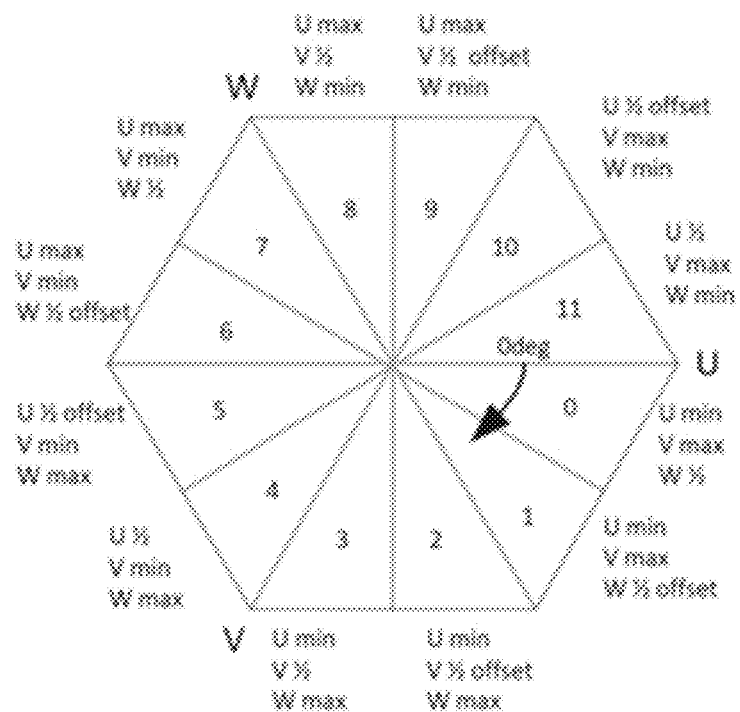
FIG. 10 shows the modified scheme as portrayed in an inverter voltage switching hexagon.

FIG. 10 shows the modified scheme as portrayed in an inverter voltage switching hexagon. As with FIG. 2, this is a graphical representation of the voltage vectors used to control the voltages on each of the three phases U, V, and W. Whilst the hexagon of FIG. 2 shows active vectors $V_1$ to $V_6$, due to the symmetry of the modified scheme, each of the six segments (each representing 60 degrees) may be split into two 30 degree segments, resulting in 12 30 degree segments. That is, we only need to consider the first half PWM period in each segment as the second half is a mirror of the first.

As such, the phases may be controlled based on the different control schemes shown in in Table 2 as shown below:

| Sector | U | V | W |
|---|---|---|---|
| 0, 7 | SVM | SVM | $T_1 > T_2$: |
| 1, 6 | SVM | SVM | $T_2 > T_1$ |
| 3, 8 | SVM | $T_1 > T_2$: | SVM |
| 2, 9 | SVM | $T_2 > T_1$ | SVM |
| 4, 11 | $T_1 > T_2$: | SVM | SVM |
| 5, 10 | $T_2 > T_1$ | SVM | SVM |

Where:
SVM: phase controlled as standard SVM for the desired voltage
$T_1>T_2$: Modified scheme as discussed in relation to FIG. 8
$T_2>T_1$: Modified scheme as discussed in relation to FIG. 9

Figure 11:
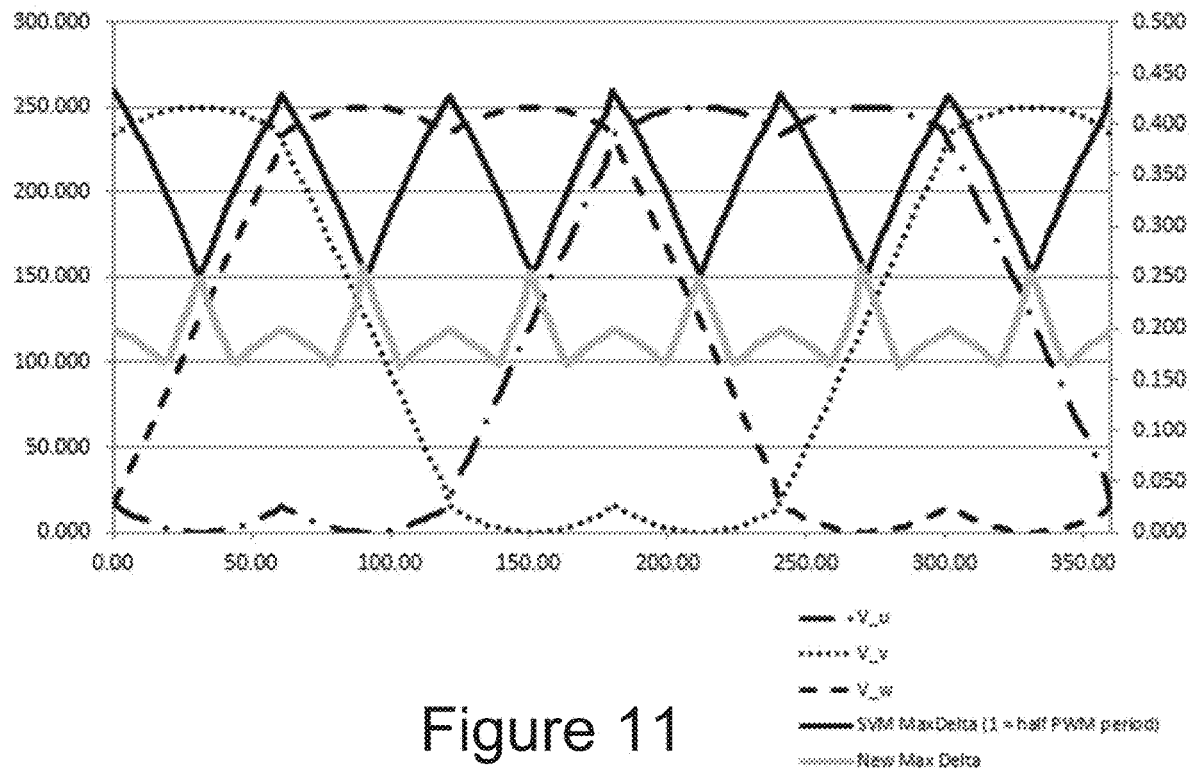
FIG. 11 shows the resulting output including the no switch delta using the modified control scheme.

FIG. 11 shows the resulting output including the no switch delta using the modified control scheme.

As can be seen, the standard SVM no-switch-delta (shown in black) has a peak-to-peak value that is greater than the no switch delta of the modified scheme (shown in green).

Figure 12:
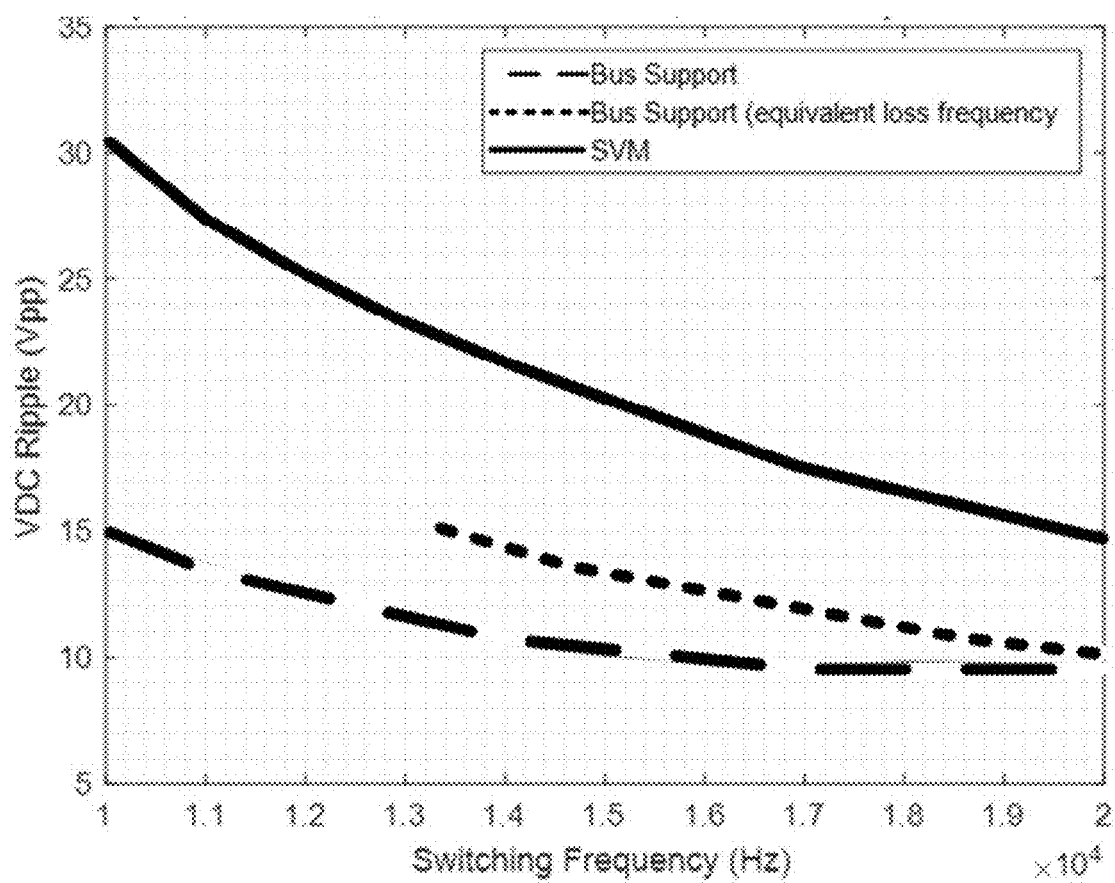
FIG. 12 shows a plot of the DC voltage ripple for a given dc capacitance for different switching frequencies for standard SVM and the modified scheme.

Simulations have shown that at a switching frequency of 20 kHz, using a DC bus capacitor of 540 uF at 650Arms:
Standard space vector modulation: 14.7V (pk-pk) DC ripple
Modified scheme: 9.6V (pk-pk)
Reduction of 34.7%
The ripple is shown to be less than that of SVM at 30 kHz
Further simulations have shown that at a switching frequency of 16 kHz, using a DC bus capacitor of 540 uF at 650Arms:
Standard space vector modulation 18.7V (pk-pk) DC ripple
Modified scheme: 9.9V (pk-pk)
Reduction of 47.0%
The ripple is similar to that of SVM at 30 kHz FIG. 12 shows a plot of the DC voltage ripple for a given dc capacitance for different switching frequencies for standard SVM and the modified scheme. In this plot, the capacitance is 540 uF, and the switching frequency varies between 10 kHz to 20 kHz at 650Arms. The standard space vector modulation (SVM) results are shown in yellow. The results from the modified scheme (titled "bus support") is shown in blue against the same fundamental frequency. The modified scheme introduces selected extra switching and thus does increase the switching loss when comparing to the same fundamental frequency with SVM. The red curve shows the modified scheme at effective switching frequency and thus at equivalent switching loss when compared to standard SVM.

The new method requires the doubling of the switching frequency of one of the phases in order to provide the necessary switching pattern. Thus the timer values require to be updated every quarter of the original PWM period. A simple way of implementing this on a microprocessor timer is to run the PWM period at twice the cycle speed (double the frequency) and to use this to create the double switching frequency on one of the phases. The phases that remain at the original switching frequency would not have the timer events (which control their switching) placed on alternative PWM periods, thus creating a pattern at the original switching frequency. For the phase that will run at the double switching frequency, the switching events can be updated to following the required pattern in sections of time that correspond to a quarter of the original PWM period. Other methods of implementation will be apparent to the skilled reader.

There are clear advantageous reductions in the DC voltage ripple when using the modified scheme as described above.

Transitions

Standard SVM and the new method with $T_1>T_2$ all start and end the PWM period with all phases being OFF. The new method with $T_1<T_2$ starts and ends the PWM period with the affected phase being ON. This causes an issue when moving into and out of the new method with $T_1<T_2$.

Figure 13:
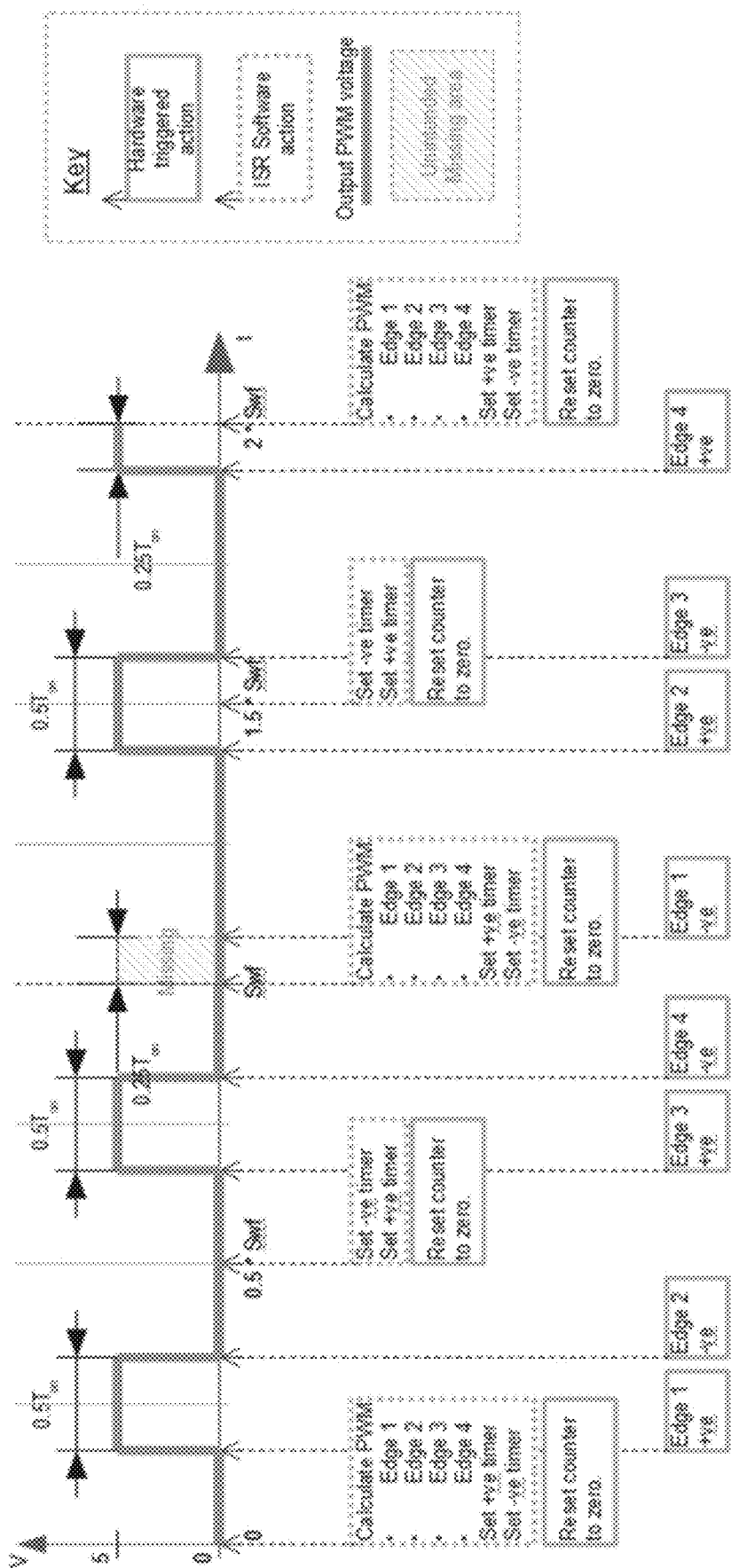
FIG. 13 shows an example timing diagram a scenario where either SVM or the $T_1 > T_2$ modified scheme precede a PWM period requiring the $T_1 < T_2$ modified scheme.

FIG. 13 shows an example timing diagram for such a scenario where either SVM or the $T_1>T_2$ modified scheme precede a PWM period requiring the $T_1<T_2$ modified scheme. Since the $T_1<T_2$ modified scheme requires the phase to be in an ON state at the start of the PWM period, we end up losing some active time because the transition point causes two back to back negative triggers, that is there is no positive trigger to bring the phase ON. This manifests in the motor as an asymmetry in the induced field and a knocking, which is audible.

Figure 14:
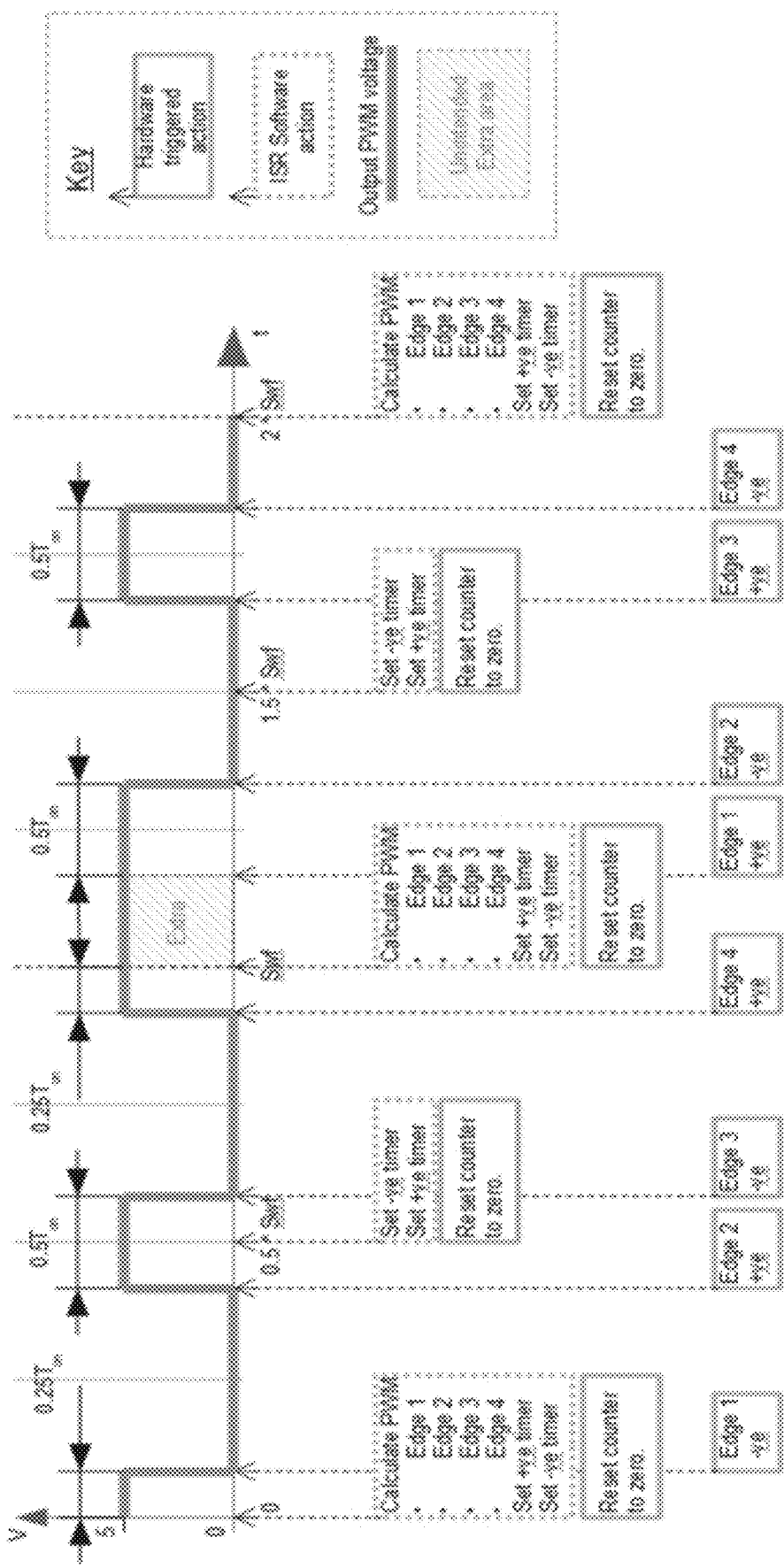
FIG. 14 shows an example timing diagram when transitioning from the $T_1 < T_2$ modified scheme to either SVM or the $T_1 > T_2$ modified scheme.

FIG. 14 shows an example timing diagram when transitioning from the $T_1<T_2$ modified scheme to either SVM or the $T_1>T_2$ modified scheme. Since the $T_1<T_2$ modified scheme ends the PWM period in an ON state, and the SVM or the $T_1>T_2$ modified scheme starts with an OFF state, there is no negative trigger. In this case, we unintentionally gain active time instead. The back to back positive trigger points means that the line stays high and we get more area than intended.

We have devised a transition scheme that addresses these scenarios.

Figure 15:
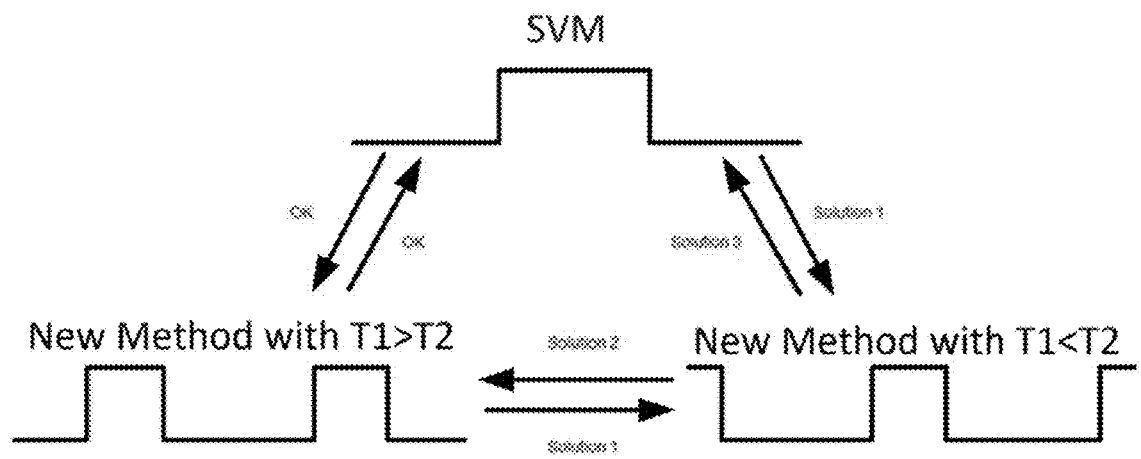
FIG. 15 shows the transitions between SVM, the $T_1>T_2$ modified scheme, and the $T_1<T_2$ modified schemes.

FIG. 15 shows the required transitions between the difference schemes, that is the transitions between SVM, and the $T_1>T_2$ modified scheme, and the $T_1<T_2$ modified scheme. We have devised three solutions in order to address the different transitions between these schemes.

As can be seen, no adjustments are required between SVM and the $T_1>T_2$ modified scheme.

Solution 1 can be used to transition between the following schemes:
  $T_1>T_2$ modified scheme to $T_1<T_2$ modified scheme
  SVM to $T_1<T_2$ modified scheme
Solution 2 can be used to transition between the following schemes:
  $T_1<T_2$ modified scheme to $T_1>T_2$ modified scheme
Solution 3 can be used to transition between the following schemes:
  $T_1<T_2$ modified scheme to SVM We will discuss each of these solutions in turn.

FIG. 16a shows Solution 1 in the case where there is a transition from the $T_1>T_2$ modified scheme to $T_1<T_2$ modified scheme.

In this solution, the timing of the switching events for the first ON portion of the PWM period, when the desired scheme is the $T_1<T_2$ modified scheme, is further adjusted to be immediately before the second ON portion. As can be seen in the figure, the "missing" ON portion is moved to be immediately before the second ON portion. In this solution, the first and second ON portions in that PWM period combine to form an ON portion having the combined durations of the first and second ON portions. As such, no active time is lost, only that the energy that would have been missed at the start of the relevant PWM period has been moved within the same period.

Figure 16B:
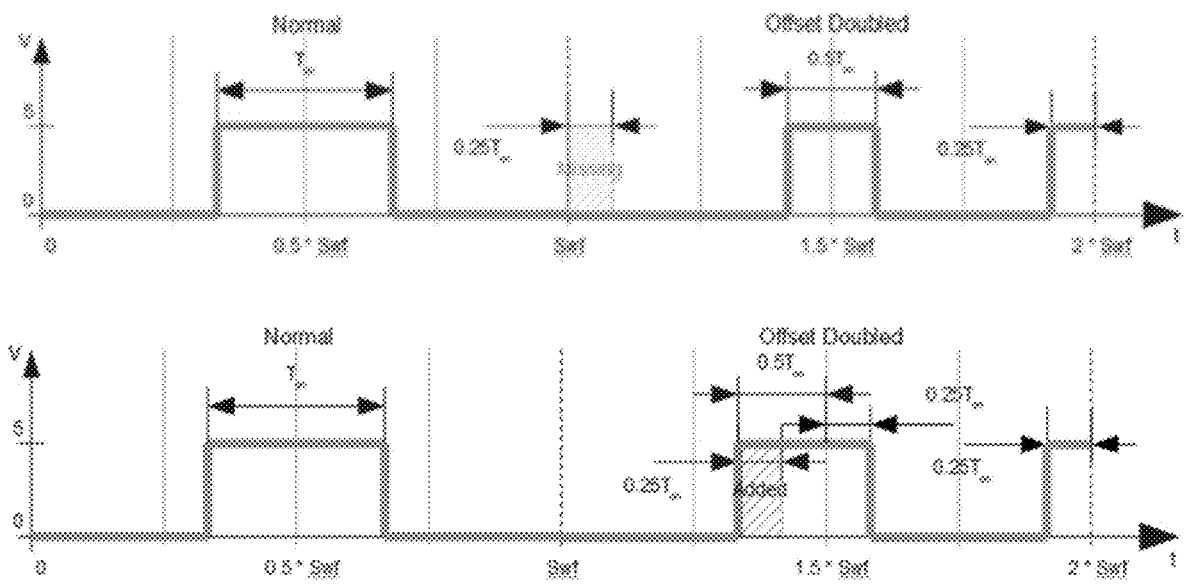

FIG. 16b shows Solution 1 in the case where there is a need to transition from SVM to the $T_1<T_2$ modified scheme. Again, the timing of the switching events of the first ON portion within the PWM period using the $T_1<T_2$ modified scheme is further adjusted to be immediately before the second ON portion such that the first and second ON portions in that PWM period combine to form an ON portion having the combined durations of the first and second ON portions.

FIG. 17 shows Solution 2 in the case where there is a transition from the $T_1<T_2$ modified scheme to the $T_1>T_2$ modified scheme.

In this solution, when the previous PWM period (using the $T_1<T_2$ modified scheme) ends during an ON period, the first ON portion in the following PWM period (using the $T_1>T_2$ modified scheme) is advanced (by adjusting the timing of the switching events) to the start of the respective PWM period such that an ON period spans the end of the previous PWM period and the start of the respective PWM period. Again, no active time is lost within the respective PWM period.

FIG. 18 shows Solution 3 in the case where there is a transition from the $T_1<T_2$ modified scheme to SVM.

In this solution, we address the scenario where the preceding PWM period (using the $T_1<T_2$ modified scheme) ends with an ON state, and when the next PWM is not using a modified scheme (i.e. so the next PWM period uses SVM, for example), so the PWM period starts with an OFF period. In this solution, the timing of the switching events in the SVM period are adjusted such that the ON period in that period is split into first and second ON portions, and the first ON portion is advanced in time within that respective PWM period to the start of that respective PWM period such that an ON period spans the end of the preceding PWM period and the start of the respective PWM period.

Preferably the second ON period in the respective PWM period has a duration that is equal to the unadjusted ON period of the respective next PWM period minus the duration of the first ON portion of the respective next PWM period. In this way, no active time is lost or gained within the respective PWM period.

When to use the Modified Methods

Whilst there is merit in using the above modified schemes for scenarios where $T_1>T_2$ and where $T_1<T_2$, it may not always be optimal to use the modified schemes across all modulation indices of the inverter. As the modulation index of the inverter decreases under standard SVM, the no switch delta periods also decrease, leading to a reduction in DC ripple voltage. In the lower values of modulation index, using the modified schemes discussed above may provide a very small or negligible decrease in the DC ripple voltage, but at the cost of increased switching losses (compared to standard SVM) due to one of the phases at any particular time switching at twice the switching frequency of any of the other phases. As discussed above, the switching losses of the modified scheme are still much lower than the prior art schemes where all phases are run at higher switching frequencies.

The modified scheme is very effective at higher power levels and higher modulation index as it supports the DC bus during peak performance conditions.

As such, it would be beneficial to be able to switch the modified schemes on and off (during the off times a scheme such as SVM can be implemented) depending on conditions under which the inverter is to operate. Since we are already switching between schemes on a per-PWM period basis, it would also be desirable to switch the modified scheme on and off under the same per-PWM period basis.

In order to address this, two parameters may be used to determine which scheme (modified on, or modified off) is to be used:

Desired operating modulation index of the inverter
Value of DC bus ripple voltage With regards to the modulation index of the inverter, it has been found that the modified schemes provide the most improvement with regards to the reduction in DC bus ripple voltage when the modulation index of the inverter is at unity or greater. And since the decision can be made on a per-PWM period basis, the modified scheme could be feathered in the transition between no modified scheme to full modified scheme as the modulation index approaches unity, reaches unity, and then goes beyond unity.

With regards to the DC bus ripple voltage, the decision of whether or not to implement the modified schemes could be based on a maximum allowable peak-to-peak value of the DC bus ripple voltage. When the DC bus ripple voltage exceeds the maximum allowable value (which could be different depending on the applications), the modified schemes may be implemented, and then when the DC bus ripple voltage goes below the maximum allowable value, the modified schemes may be switched off (in which case SVM, or whatever PWM scheme is being use, is implemented).

FIGS. 19a and 19b show example DC bus link ripple voltages under different conditions over one output frequency wave, where the peak to peak DC bus ripple is the envelope of the waveform. FIG. 19c shows one example threshold level for deciding whether or not to implement the modified scheme (here labelled as bus support). For any DC bus ripple voltage that exceeds that threshold, the modified schemes are implemented, and for a DC bus ripple voltage below that threshold, a standard scheme such as SVM is used. As can be seen, the use of the modified schemes may only be used for portions of the output frequency wave, relating to one or more PWM periods.

With reference again to FIG. 10 and Table 2, the segment in which the system operates at any particular time is defined by the modulation angle, which is what determines the 60 deg segments and the 30 deg segments. 60 deg segment are associated with the standard SVM implementation. We look at the angle through this 60 deg segment to determine which of the 30 deg segments we are in. The 30 deg segments split the 60 deg segment down the middle, so are aligned to the 60 deg segments.

The previous operating segment is stored, for example in memory, so that a determination of whether or not a transition (Solutions 1, 2 or 3) is needed in light of the next known operating segment. A look up table, based on FIG. 10, may be referenced from memory in order to do this. Note that FIG. 10 shows the 12, 30 deg segments.

The modulation angle is the output voltage angle. Using this, and the threshold shown in FIG. 19c, a determination of whether to operate in SVM or the modified (bus support) mode can be made. The threshold is held in a look table (also stored in memory) with entries in terms of output current and other parameters. This table contains values that define the range of the output wave (for example in degrees electrical) when the inverter should be operated in bus support.

For example, these angles may be within the first 180 deg of the output wave and the controller may add 180 to them to determine the range in the second 180 deg. A value of 180 or greater means remain in SVM for all angles. A value of 0 means always be in SVM. Other ways of implementing such decisions may be apparent to the skilled reader.

Equations may be used instead of a lookup table. A combination of tables and equations is also possible.

Figure 1:
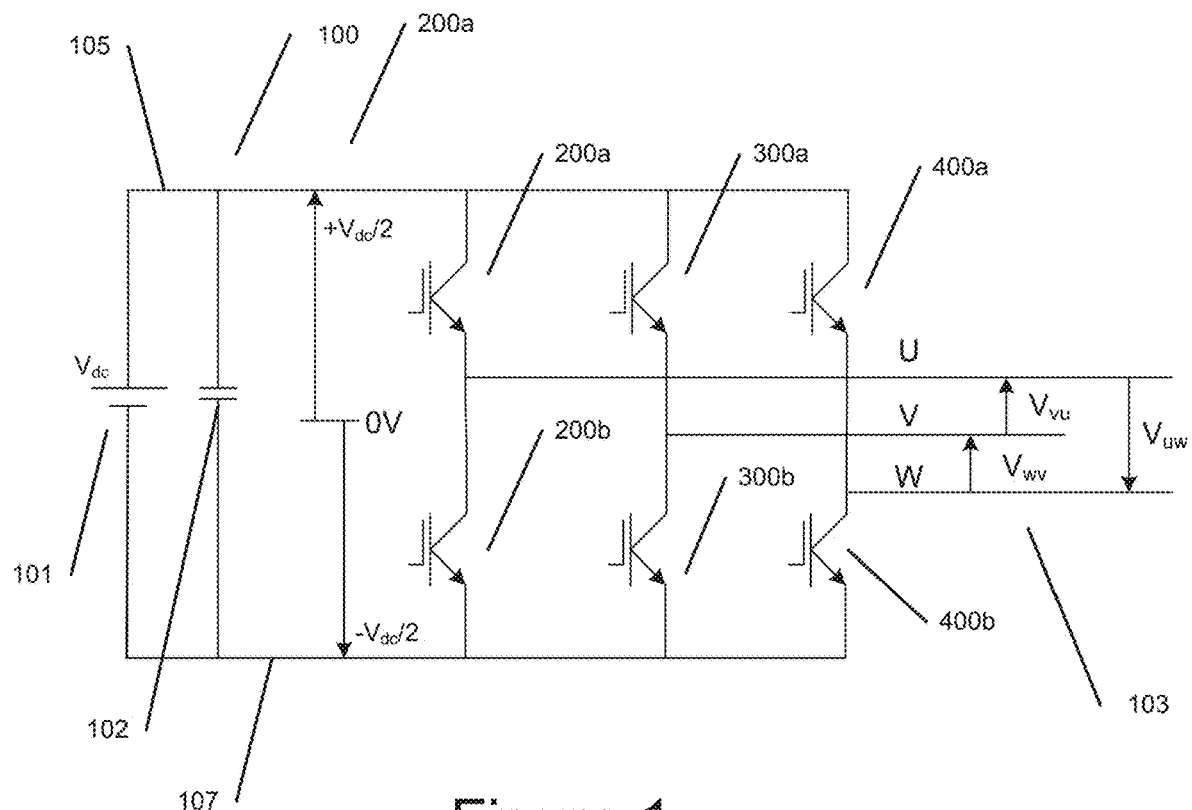
FIG. 1 shows a simplified schematic of an inverter.

All of the above methods may be implemented in a controller, in hardware or software, coupled to the controllable switches as shown for example in FIG. 1. However, such a controller is not limited to the physical arrangement of FIG. 1. For example, whilst FIG. 1 is a simplified prior art converter/inverter on which the above-mentioned modified method may be implemented, it is noted that this method is also applicable to multi-level converters, that is, converters having more than the two DC voltages shown in FIG. 1.

No doubt many other effective alternatives will occur to the skilled person. It will be understood that the invention is not limited to the described embodiments and encompasses modifications apparent to those skilled in the art lying within the scope of the claims appended hereto.

The invention claimed is:

1. A method of generating a three-phase output voltage for powering an electrical load, the method comprising:
receiving an input voltage from a voltage source and controlling a controller, using Pulse Width Modulation (PWM) over a plurality of PWM periods, to generate a three phase AC output for an electrical load, each of the plurality of PWM periods comprising one or more switching events, the switching events comprising rising and falling edges between a low voltage and a high voltage to provide ON periods at the high voltage and OFF periods at the low voltage, each of the plurality of PWM periods generating a portion in time of the three phase AC output voltage;
for each respective PWM period:
determine a plurality of switching events for each of the three phases to provide a target output voltage for the respective PWM period; and
compare the switching events across each of the three phases to determine a first time period between a first and second switching event across all of the phases, and a second time period between the second and a third switching event across all of the phases; and
adjusting the timing of one or more switching events in only one of the phases in the respective PWM period in response to the determined first or second time period being greater than a threshold in order to reduce the determined first or second time period.

2. The method according to claim 1, wherein, when the first time period between the first and second switching events is greater than the second time period between the second and third switching events for the respective PWM period, the switching events in the only one of the phases are adjusted such that the ON period is split into first and second ON portions, and wherein the first ON portion is advanced in time and the second ON portion is delayed in time within the respective PWM period.

3. The method according to claim 2, wherein the first and second ON portions are equal in duration.

4. The method according to claim 2, wherein, when the previous PWM period ends during an OFF period, the first ON portion is advanced to be centred around the time associated with a ¼ of the PWM period.

5. The method according to claim 4, wherein the respective PWM period starts and/or ends with the only one phase in the OFF state.

6. The method according to claim 2, wherein, when the previous PWM period ends during an ON period, the first ON portion is advanced to the start of the respective PWM period such that an ON period spans the end of the previous PWM period and the start of the respective PWM period.

7. The method according to claim 4, wherein the second ON portion is delayed in time to be centred around the time associated with ¾ of the PWM period.

8. The method according to claim 1, wherein, when the second time period between the first and second switching events is greater than the first time period between the second and third switching events for the respective PWM period,
the switching events are adjusted such that the ON period is split into first, second and third ON portions, the first ON portion being advanced towards the start of the respective PWM period, the second ON portion occurring centred around the time associated with ½ of the PWM period, and the third ON portion being delayed towards the end of respective PWM period.

9. The method according to claim 8, wherein the first ON portion is advanced to the start of the respective PWM period and the third ON portion is delayed to the end of the respective PWM period, such that the respective PWM period starts and ends with the only one phase in the ON state.

10. The method according to claim 8, wherein the respective PWM period comprises a first OFF period between the first and second ON portions centred around the time associated with a $1/4$ of the PWM period.

11. The method according to claim 8, wherein, when the previous PWM period ends with an OFF state, the first ON portion is further adjusted to be immediately before the second ON portion such that the first and second ON portions combine to form an ON portion having the combined durations of the first and second ON portions.

12. The method according to claim 8, wherein the respective PWM period comprises a second OFF period between the second and third ON portions centred around the time associated with ¾ of the PWM period.

13. The method according to claim 8, wherein, when the respective PWM period ends with an ON state, and when the next PWM period starts with an OFF period and the determined time period for the respective next PWM period is less than the threshold, the method comprises adjusting the timing of one or more switching events in the only one of the phases in the respective next PWM period.

14. The method according to claim 13, wherein, the timing of the switching events in the only one of the phases for the respective next PWM period are adjusted such that an ON period is split into first and second ON portions, and wherein the first ON portion is advanced in time within the respective next PWM period.

15. The method according to claim 14, wherein the first ON portion in the respective next PWM period is advanced in time to the start of the respective next PWM period such that an ON period spans the end of the respective PWM period and the start of the respective next PWM period.

16. The method according to claim 13, wherein the second ON period in the respective next PWM period has a duration that is equal to the unadjusted ON period of the respective next PWM period minus the duration of the first ON portion of the respective next PWM period.

17. The method according to claim 1, wherein the plurality of switching events causes a voltage ripple on the supply voltage, and wherein the method comprises:
for each respective PWM period, determine the peak to peak voltage ripple on the supply voltage for the target output voltage for the respective PWM period; and
wherein the step of adjusting the timing of one or more switching events in only one of the phases in the respective PWM period occurs when the peak to peak voltage ripple on the supply voltage is greater than a threshold value.

18. The method according to claim 1, wherein the step of adjusting the timing of one or more switching events in only one of the phases in the respective PWM period occurs when a modulation index of the output voltage is greater than or equal to unity.

19. The method according to claim 1, wherein the electrical load comprises an electric motor.

20. An inverter for generating a three-phase output voltage for powering an electrical load, the inverter comprising:
an input for receiving an input voltage;
three AC outputs, one per phase, for outputting a three phase AC output voltage for powering an electrical load;
a controller for controlling the input voltage using Pulse Width Modulation (PWM) over a plurality of PWM periods to generate the three phase AC output voltage for an electric motor, each of the plurality of PWM periods comprising one or more switching events, the switching events comprising rising and falling edges between a low voltage and a high voltage to provide ON periods at the high voltage and OFF periods at the low voltage, each of the plurality of PWM periods generating a portion in time of the three phase AC output voltage;
wherein the controller is configured to:
for each respective PWM period:
determine a plurality of switching events for each of the three phases to provide a target output voltage for the respective PWM period; and
compare the switching events across each of the three phases to determine a first time period between a first and second switching event across all of the phases, and a second time period between the second and a third switching event across all of the phases; and
wherein the controller is configured to adjust the timing of one or more switching events in only one of the phases in the respective PWM period in response to the determined first or second time period being greater than a threshold in order to reduce the determined first or second time period.

21. The inverter according to claim 20, wherein, when the first time period between the first and second switching events is greater than the second time period between the second and third switching events for the respective PWM period, the controller is configured to adjust the timing of the switching events in the only one of the phases such that the ON period is split into first and second ON portions, and wherein the first ON portion is advanced in time and the second ON portion is delayed in time within the respective PWM period.

22. The inverter according to claim 21, wherein the first and second ON portions are equal in duration.

23. The inverter according to claim 21, wherein, when the previous PWM period ends during an OFF period, the first ON portion is advanced to be centred around the time associated with a ¼ of the PWM period.

24. The inverter according to claim 23, wherein the respective PWM period starts and/or ends with the only one phase in the OFF state.

25. The inverter according to claim 23, wherein the second ON portion is delayed in time to be centred around the time associated with ¾ of the PWM period.

26. The inverter according to claim 21, wherein, when the previous PWM period ends during an ON period, the first ON portion is advanced to the start of the respective PWM period such that an ON period spans the end of the previous PWM period and the start of the respective PWM period.

27. The inverter according to claim 20, wherein, when the second time period between the first and second switching events is greater than the first time period between the second and third switching events for the respective PWM period, the controller is configured to adjust the timing of the switching events such that the ON period is split into first, second and third ON portions, the first ON portion being advanced towards the start of the respective PWM period, the second ON portion occurring centred around the time associated with ½ of the PWM period, and the third ON portion being delayed towards the end of respective PWM period.

28. The inverter according to claim 27, wherein first ON portion is advanced to the start of the respective PWM period and the third ON portion is delayed to the end of the respective PWM period, such that the respective PWM period starts and ends with the only one phase in the ON state.

29. The inverter according to claim 27, wherein the respective PWM period comprises a first OFF period between the first and second ON portions centred around the time associated with a ¼ of the PWM period.

30. The inverter according to claim 27, wherein, when the previous PWM period ends with an OFF state, the first ON portion is further adjusted to be immediately before the second ON portion such that the first and second ON portions combine to form an ON portion having the combined durations of the first and second ON portions.

31. The inverter according to claim 27, wherein the respective PWM period comprises a second OFF period between the second and third ON portions centred around the time associated with ¾ of the PWM period.

32. The inverter according to claim 27, wherein, when the respective PWM period ends with an ON state, and when the next PWM period starts with an OFF period and the determined time period for the respective next PWM period is less than the threshold, the controller is configured to adjust the timing of one or more switching events in the only one of the phases in the respective next PWM period.

33. The inverter according to claim 32, wherein, the controller is configured to adjust the timing of the switching events in the only one of the phases for the respective next PWM period such that an ON period is split into first and second ON portions, and wherein the first ON portion is advanced in time within the respective next PWM period.

34. The inverter according to claim 33, wherein the first ON portion in the respective next PWM period is advanced in time to the start of the respective next PWM period such that an ON period spans the end of the respective PWM period and the start of the respective next PWM period.

35. The inverter according to claim 32, wherein the second ON period in the respective next PWM period has a duration that is equal to the unadjusted ON period of the respective next PWM period minus the duration of the first ON portion of the respective next PWM period.

36. The inverter according to claim 20, wherein the plurality of switching events causes a voltage ripple on the supply voltage, and wherein the controller is configured to:
for each respective PWM period, determine the peak to peak voltage ripple on the supply voltage for the target output voltage for the respective PWM period; and
wherein the controller is configured to adjust the timing of one or more switching events in only one of the phases in the respective PWM period occurs when the peak to peak voltage ripple on the supply voltage is greater than a threshold value.

37. The inverter according to claim 20, wherein the controller is configured to adjust the timing of one or more switching events in only one of the phases in the respective PWM period when a modulation index of the output voltage is greater than or equal to unity.

38. The inverter according to claim 20, wherein the electrical load comprises an electric motor.

* * * * *